United States Patent [19]

Juskey et al.

[11] Patent Number: 5,065,122
[45] Date of Patent: Nov. 12, 1991

[54] TRANSMISSION LINE USING FLUROPLASTIC AS A DIELECTRIC

[75] Inventors: Frank J. Juskey; Anthony B. Suppelsa, both of Coral Springs; Jill L. Flaugher, Margate, all of Fla.

[73] Assignee: Motorola, Inc., Schaumburg, Ill.

[21] Appl. No.: 577,177

[22] Filed: Sep. 4, 1990

[51] Int. Cl.$^5$ .............................................. H01P 3/08
[52] U.S. Cl. ...................................... 333/238; 29/600
[58] Field of Search ................ 333/238, 246; 29/600; 156/47, 55; 361/399; 174/52.2

[56] References Cited

U.S. PATENT DOCUMENTS

| | | | |
|---|---|---|---|
| 3,586,757 | 6/1971 | Haldeman, Jr. | 333/238 X |
| 3,612,744 | 10/1971 | Thomas | 333/238 X |
| 3,895,435 | 7/1975 | Turner et al. | 333/238 X |
| 4,494,083 | 1/1985 | Josefsson et al. | 333/238 X |
| 4,812,792 | 3/1989 | Leibowitz | 333/238 |
| 4,825,283 | 4/1989 | Shino | 361/399 X |
| 4,983,237 | 1/1991 | Alfing | 29/600 X |

Primary Examiner—Paul Gensler
Attorney, Agent, or Firm—Daniel K. Nichols

[57] ABSTRACT

A multilayer substrate having an integral transmission line structure 300 is disclosed. The transmission line structure 300 is formed by metallizing a fluroplastic substrate on the inner surface 112 and outer surface 114 in order to form a transmission line. The metallized inner surface forms a conductive runner 106, while the outer metallized surface 114 forms a ground plane, with the fluroplastic substrate being the dielectric. The transmission line structure 300 is then encapsulated by two substrate layers (402, 404).

13 Claims, 4 Drawing Sheets

TRANSMISSION LINE USING FLUROPLASTIC AS A DIELECTRIC

Technical Field

This invention relates generally to transmission lines (i.e. stripline resonators, microstrip circuits, high speed conductive lines, etc.), specifically to transmission lines utilizing fluroplastic material for the dielectric, and more specifically to transmission lines utilizing fluroplastics, which are internal to multilayer circuit boards.

BACKGROUND

Transmission lines play an important role in many phases of radio communications. In particular, stripline resonators, microstrip circuits, high speed conductive lines, etc. are used extensively in modern day radios. Some of the major technical problems encountered in implementing transmission lines in multilayer circuit boards are the delay effects, and dielectric losses caused by the dielectric material. A need for dielectric materials having lower dielectric constants is required when implementing certain types of transmission line structures. Propagation delays and dielectric losses can be lowered by utilizing dielectric materials with lower dielectric constants.

A major drawback in utilizing materials with low dielectric constants is that they are normally much more expensive than the standard glass epoxies used in modern multilayer circuit boards. A particular group of materials which have lower dielectric constants than standard glass epoxies are fluroplastics (i.e. one specific type is polytetrafluoroethylene, or as it is more commonly known, TEFLON TM, manufactured by Dupont, Inc.). Fluroplastics have dielectric constants under 3.0 to 6.0 for conventional glass epoxy mixtures. The major problems encountered when using fluroplastics such as TEFLON TM as dielectric substrate material is their high cost, and their difficulty in bonding to other substrate materials such as glass epoxies. Typically, the fluroplastic surface has to be chemically treated in order to accept bonding to other materials such as glass epoxies, making the process costlier to produce. A need exists in the art for the cost effective use and manufacture of fluroplastic dielectrics in transmission line structures, and especially in multilayer circuit boards.

SUMMARY OF THE INVENTION

Briefly, according to the invention, a fluroplastic layer is metallized on at least one side forming a transmission line stucture. The transmission line stucture is then positioned between two substrate layers forming a multilayer circuit board with an integral transmission line.

In one aspect of the invention two layers of fluroplastic are used, with each of the fluroplastic outer layers having ground planes, and a conductive runner positioned between the two layers, thereby forming a transmission line. The two layers are then bonded together forming a fluroplastic laminate. In still another aspect of the invention, at least one through hole is formed on the laminate in order to facilitate in encapsulating the laminate between the two substrate layers.

A method of manufacturing a multilayer substrate having an integral transmission line includes the steps of metallizing at least one side of the fluroplastic layer in order to form a transmission line; and encapsulating the transmission line structure within two opposed substrates, thereby forming a multilayer substrate.

In one aspect of the method of manufacturing, a plurality of through holes are formed in the transmission line structure in order to facilitate the encapsulation (bonding) of the structure.

In a second aspect of the method of manufacturing, a recess is formed on one of the two substrates in order to facilitate the placement of the transmission line structure.

DETAILED DESCRIPTION OF THE PREFERRED EMBODIMENT

Figure 1:
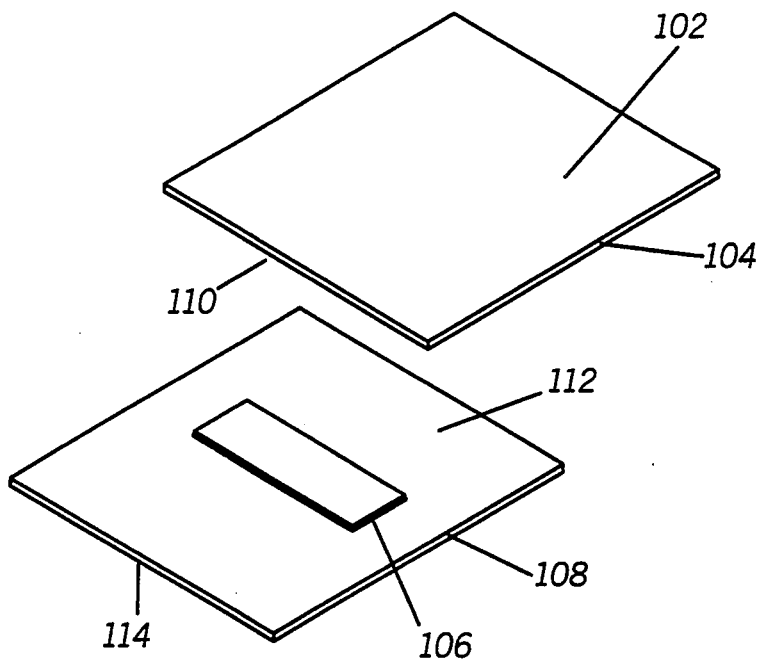
FIG. 1 is an exploded view of two fluroplastic layers, in accordance with the present invention.

Referring now by characters of reference to the drawings and first to FIG. 1, an exploded view of a transmission line structure is shown. The transmission line structure is comprised of at least one fluoplastic layer 108. The first fluroplastic layer has an outer surface 114, which is preferably metallized to form a ground plane, and opposed inner surface 112 which is metallized to form a conductive runner 106. The first fluroplastic layer does not need to have the outer surface 114 metallized, specifically when implementing a high speed runner. The optional second fluroplastic layer 104 also has inner and outer opposed surfaces, 110 and 102, respectively, with the outer surface 102 preferably metallized to form a ground plane. Those skilled in the art will appreciate that a second fluroplastic layer is used when forming transmission line structures such as striplines, which require two ground planes between the conductive runner 106, while a microstrip structure would require just one ground plane substantially parallel to the conductive runner 106, thereby requiring just one fluroplastic layer instead of two. The transmission line structure 300 shown in FIG. 3 can take the form of a stripline, microstrip, conductive runner, or other similar transmission line.

The two fluroplastic layers are preferably constructed of polytetrafluroethylene (PTFE, a member of the fluroplastic group) which is commonly known as Teflon TM manufactured by Du Pont, Inc., and by other manufacturers under different tradenames. The major benefit of using PTFE is that it has a very low dielectric constant. Derivatives of fluroplastics such as polytetrafluroethylene that are reinforced with glass fibers, epoxies, or ceramics, such as RO-2800 TM manufactured by Rogers Corp.; or Gore-Clad TM or Gore-Ply TM which are manufactured by W.L. Gore and Associates, Inc; can also be utilized for the fluroplastic layers of the present invention. The benefits of reinforced PTFE are the greater mechanical characteristics achieved, than with non-reinforced PTFE. The drawback to reinforcing PTFE is the increased cost of the reinforced PTFE over standard PTFE. A major benefit of the present invention it that it can employ non-reinforced PTFE in a multilayer structure only where the benefits of the PTFE are most needed, and allows for the bonding of PTFE to other layers without having to chemically treat the PTFE prior to encapsulation (bonding). The fluroplastic layers could also be manufactured of other fluroplastics and their derivatives, which include but are not limited to fluorinated ethylene propylene copolymer (FEP), perfluoroalkoxy resin (PFA), polychlorotrifluoroethylene (PCTFE), ethylene-chlorotrifluoroethylene copolymer (ECTFE), ethylene- tetrafluoroethylene copolymer (ETFE), polyvinylidene fluoride (PVDF), polyvinylfluoride (PVF), and reinforced fluoroplastics which include glass, ceramic, or epoxy resin mixtures. The first and second fluroplastic layers are preferably 0.003 inches thick as shown by 108 and 104, respectively.

Figure 2:
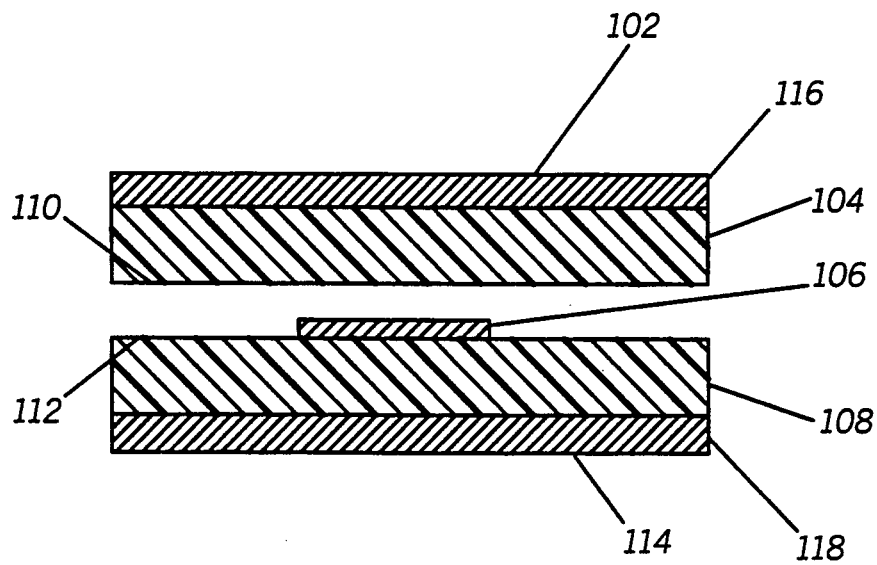
FIG. 2 is a cross-sectional view of FIG. 1.

FIG. 2 shows a cross-sectional view of FIG. 1, showing the conductive runner 106 which has a prefered thickness of 0.00025 inches. The two fluroplastic layers have the the outer surfaces 102 and 114 metallized to form ground planes 116 and 118 having a metallized thickness 0.00025 inches. The two fluroplastic layers are metallized using conventional wet chemistry techniques known in the art. The inner thickness of both the first layer 108 and the second layer 104 act as a dielectric between the conductive runner 106, and the ground planes 116 and 118.

Figure 3:
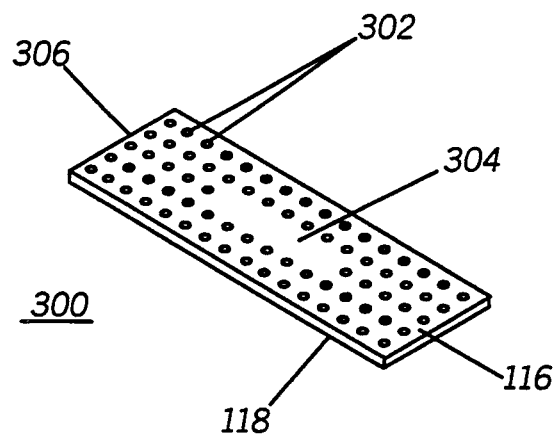
FIG. 3 is a top view of a transmission line structure.

FIG. 3 shows the transmission line structure 300 with the two fluroplastic layers bonded together forming a fluroplastic laminate 306. The two fluroplastic layers can be bonded into a fluroplastic laminate 306 by following conventional fluroplastic bonding techniques which are known in the art, which preferably include the steps of:

a). Placing the two fluroplastic boards together in a press
b). Applying pressure from 100–200 psi, preferably closer to 100 psi
c). Holding in press until temperature of laminate reaches a minimum of 250 degrees Fahrenheit, but no more than 300 degrees Fahrenheit
d). Holding at temperature for approximately 10 minutes
e). Cooling under pressure to less than 125 degrees Fahrenheit before removing from press The above mentioned steps can be adjusted according to the size and type of fluroplastic that is being bonded, in order to get ideal results.

The transmission line structure 300 also has at least one but preferably a plurality of through holes or apertures 302 which are formed preferably after the two fluroplastic layers are bonded together. The through holes 302 facilitate in the encapsulation (bonding) of the transmission line structure 300 by allowing for encapsulation (bonding) to take place partially through the apertures 302. Since the transmission line structure is preferably smaller in size than the substrates 402 and 404 shown in FIG. 4a, the substrates will bond to each other directly in a substantial portion of their surface area. The apertures 302 are preferably not made in the location near where the conducting runner 106 is approximately found within the two fluroplastic layers, as shown by area 304. The apertures 302 can be made on the transmission line structure 300 by conventional drilling or other techniques used in the art. FIG. 3 further shows the two outer surfaces of the transmission line structure which are ground planes 116 and 118.

Figure 4A:
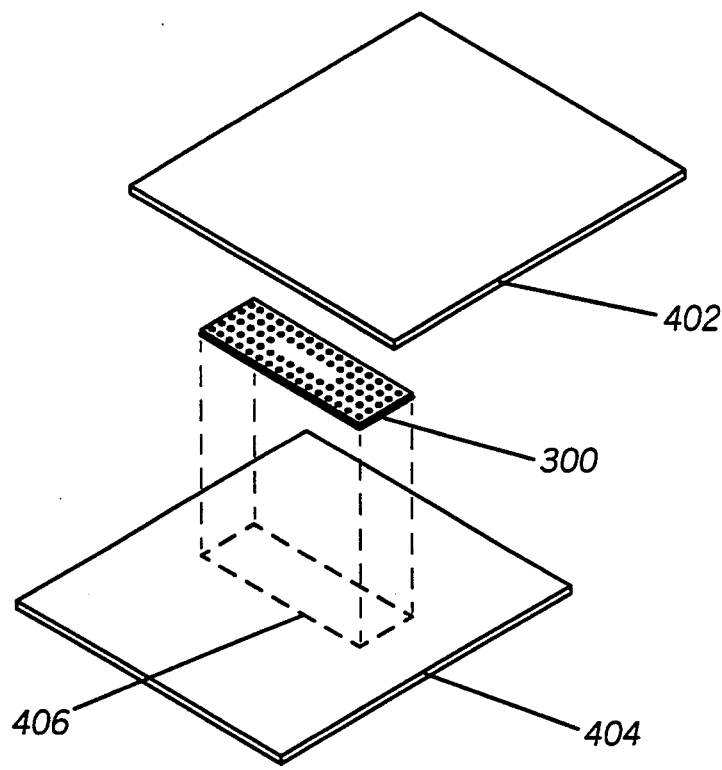
FIG. 4a is an exploded view of a transmission line structure between two opposed substrates, in accordance with the present invention.

FIG. 4a shows an exploded view of the transmission line structure 300 positioned between two opposed substrates (layers) 402 and 404. Substrates or layers 402 and 404 are preferably made out of a glass epoxy mixture such as FR4 material which is commonly used in the art for multilayer circuit boards. The reason for preferably using glass epoxy mixture instead of fluroplastic for the two layers 402 and 404 is the cost differential between the two is very substantial, but fluroplastic can be used if desired. Any other type of commonly used materials that are currently employed in the manufacture of multilayer boards can be employed for substrates 402 and 404. By using the fluroplastic only in the transmission line structure 300 where the benefits of having a low dielectric constant are substantial, a great cost savings can be realized. The transmission line structure 300 is placed on one of the two substrates 402 or 404 (shown placed on 404) in the location 406 were it will reside prior to the encapsulation by the two layers 402 and 404. The two substrates 402 and 404 are preferably larger in size than the transmission line structure 300, thereby having a greater cost savings in the manufacture of the structure. By having the transmission line smaller in size than the two substrates, one reduces the use of the costly fluroplastic by using the fluroplastic only where it is needed. The two substrates 402 and 404 can be metallized with runners, vias, etc. before the encapsulation (bonding) step. Once the two substrates are bonded together, they form a multilayer substrate with an integral transmission line.

Figure 4B:
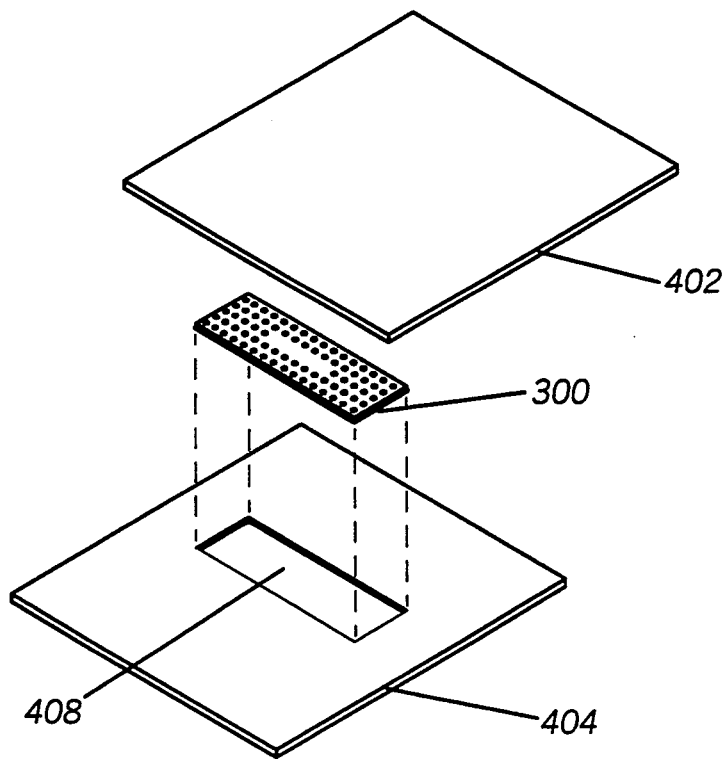
FIG. 4b is an exploded view of a transmission line structure between two opposed substrates, with one of the substrates having a recess for the location of the transmission line structure.

FIG. 4b shows an alternate method of placing the transmission line structure 300 between the two opposed substrates 402 and 404. A recess or well 408 on one of the two substrates (layers) 402 or 404, is formed thereby holding the transmission line structure 300 in place during encapsulation. The recess 408 allows for the precise placement of the transmission line structure 300.

Figure 5:
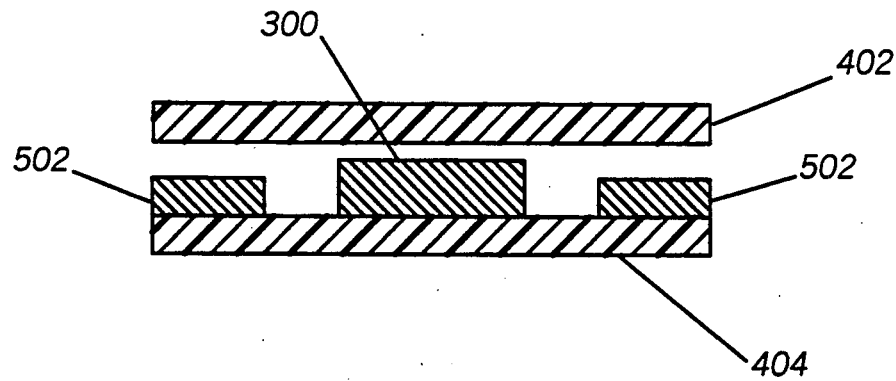
FIG. 5 is a cross sectional view of a transmission line structure between two opposed substrates, with one of the substrates having metallized areas, in accordance with the present invention.

FIG. 5 shows a cross-sectional view of the transmission line structure 300 prior to encapsulation between the two substrates 402 and 404. Substrate 404 is shown having metallized areas or runners 502 such as those found in conventional multilayer printed circuit boards (multilayer substrate). The runners 502 have a metallized thickness of approximately 0.0015 inches, and are formed by conventional metallization techniques.

Figure 6:
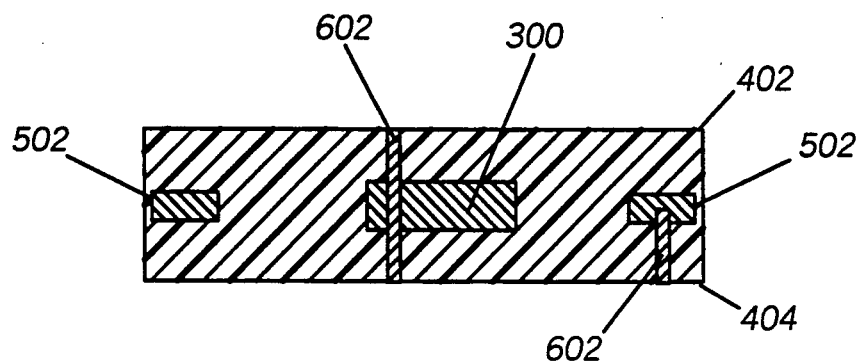
FIG. 6 is a cross-section of the completed multilayer substrate with integral transmission line, in accordance with the present invention.

FIG. 6 shows the multilayer substrate with the transmission line structure 300 encapsulated between two substrates 402 and 404 which are shown already bonded together. Metallized vias 602 are shown which allow for the coupling of the transmission line structure 300 and runners 502 to other subsequent layers which are not shown, but which could be available in a multilayer printed circuit board. The two FR4 layers 402 and 404 are bonded together by way of conventional polymide lamination cycle. A preferred encapsulation (bonding) cycle includes the steps of:

a). Placing the two layers 402 and 404 with the transmission line structure 300 positioned between the two layers in a press b). Applying pressure from 200–500 psi, pressure used depends on the size of layers 402, and 404 c). Holding in press until temperature of laminate reaches a temperature between 330 and 425 degrees Fahrenheit, but preferably no more than 425 degrees Fahrenheit.

d). Holding at temperature for approximately 2 to 3 hours e). Cooling under pressure to less than 150 degrees Fahrenheit before removing from press, cooling time should be approximately 20–25 minutes.

The through holes (apertures) 302 on the transmission line structure 300 facilitate in the bonding of the two layers 402 and 404 by allowing for the bonding to take place partially through the apertures 302. The formation of the through holes 302, allows for the outer surfaces of the transmission line structure 300 not to require "chemical treatment" prior to the encapsulation step, as is commonly required with fluroplastics. The bonding of the two substrates will take place partially through the apertures 302, thereby holding the transmission line structure 300 between the two substrates 402 and 404.

Figure 7A:
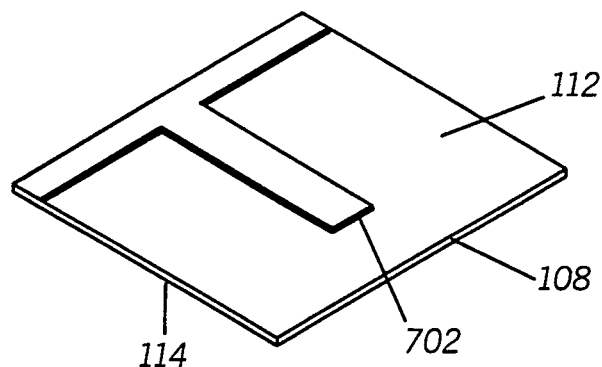
FIG. 7a is an alternate fluroplastic layer having a stripline resonator structure.
Figure 7B:
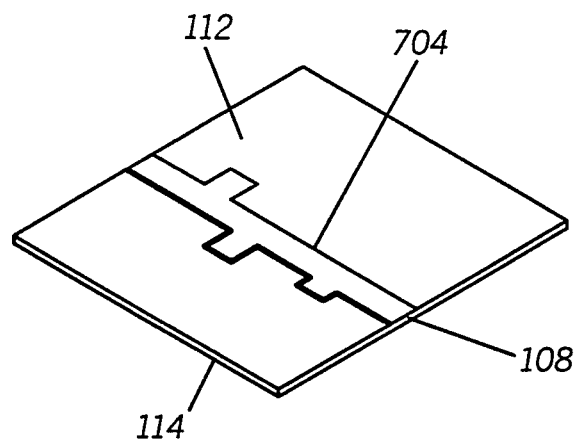
FIG. 7b is a second alternate fluroplastic layer having a microstrip structure.

FIG. 7A shows an alternate configuration for conductive runner 106 which is shown as a stripline 702. The stripline 702 is formed by metallizing the inner surface 112 of fluroplastic layer 108, and metallizing a ground plane on the outer surface 114. A second fluroplastic layer having a ground plane would be required to complete the stripline structure, which is not shown. Finally, FIG. 7b shows a conventional microstrip 704 which is formed by metallizing inner surface 112 of fluroplastic layer 108.

The structural features and functional advantages of the transmission line using a fluroplastic dielectric have been described above, but for completeness of disclosure a brief description of the manufacture of the transmission line will be given. It will be understood that the type of transmission line desired will depend on the structure of the conductive runner 106, and the one or more ground planes 116 and 118 which are used. As shown in FIG. 1 the first step in the manufacture is to metallize the one or more fluroplatic layers, with one of the layers having a conductive runner 106 metallized in the inner surface 112, thereby forming a transmission line. Preferably, the two fluroplastic layers are then bonded together forming a transmission line structure 300. The transmission line structure 300 is then encapsulated (bonded) to opposed substrates 402 and 404 by conventional lamination techniques. Before the encapsulation (bonding) step an alternate step of forming through holes or apertures 302 on the fluroplastic laminate further facilitating the encapsulation step can be accomplished. The through holes 302 allow for the transmission line structure 300 to be held in place between the two substrates 402 and 404. The encapsulation (bonding) will take place partially between the through holes 302 thereby holding the transmission line structure 300. A second alternate step of forming a recess 408 on one of the two layers 402 and 404 can also be done in order to facilitate in the placement of the transmission line structure 300 during manufacture.

While the present invention has been described in conjunction with specific embodiments, it is evident that many alternatives, modifications and variations will be apparent to those skilled in the art in light of the foregoing description. Accordingly it is intended that the present invention embrace all such alternatives, modifications, and variations as fall within the broad scope of the appended claims.

What is claimed is:

1. A multilayer substrate having an integral transmission line, comprising:

a transmission line structure, including at least one fluroplastic layer, the transmission line structure having a plurality of through holes; and opposed substrates both having inner and outer opposed surfaces and having the transmission line structure positioned between them, the opposed substrates are bonded together at least partially through the plurality of through holes which are filled with resin.

2. The multilayer substrate having an integral transmission line of claim 1, wherein one of the opposed substrates further includes a recess for receiving the transmission line structure.

3. A multilayer substrate having an integral transmission line, comprising:

a transmission line structure, including a first fluroplastic layer; and opposed substrates with the transmission line structure positioned in a predetermined location between them, the transmission line structure being substantially smaller in size than either of the opposed substrates and further having a plurality of through holes, and having the opposed substrates bonded together at least partially through the plurality of through holes in the transmission line structure.

4. A multilayer substrate having an integral transmission line as defined in claim 3, wherein the first fluroplastic layer has inner and outer opposed surfaces, with the inner surface having a conductive runner.

5. A multilayer substrate having an integral transmission line as defined in claim 4, wherein the transmission line structure further includes a second fluroplastic layer having inner and outer opposed surfaces, with the first and second fluroplastic layers being constructed and arranged with their respective inner surfaces facing each other, and the first and second fluroplastic layer further including ground planes on their respective outer surfaces.

6. A multilayer substrate having an integral transmission line as defined in claim 5, wherein the first and second fluroplastic layers are comprised of polyetrafluoroethylene.

7. A multilayer substrate having an integral transmission line as defined in claim 6, wherein the ground planes on both the first and second fluroplastic layers are formed by metallizing the outer surfaces of the first and second fluroplastic layer, and the conductive runner on the inner surface of the first fluroplastic layer is formed by metallizing the inner surface.

8. The method for manufacturing a multilayer substrate having an integral transmission line, comprising the steps of;

forming a transmission line structure;
  forming a plurality of through holes on the transmission line structure; and
 encapsulating the transmission line structure between opposed
 substrates, wherein the transmission line structure is smaller in size than the opposed substrates.

9. A method for manufacturing a multilayer substrate having an integral transmission line as defined in claim 8, wherein the transmission line structure is a stripline structure.

10. A method for manufacturing a multilayer substrate having an integral transmission line as defined in claim 8, wherein the transmission line structure is a microstrip structure.

11. A method of manufacturing a multilayer substrate having an integral transmission line as defined in claim 8, wherein the transmission line structure is a conductive runner.

12. A method for manufacturing a multilayer substrate having an integral transmission line, comprising the steps of:

metallizing a fluroplastic layer having inner and outer opposed surfaces on the outer surface to form a ground plane, and metallizing the inner surface to form a conductive runner, together forming a transmission line structure;

forming a plurality of through holes on the transmission line structure;

bonding a second fluroplastic layer having inner and outer opposed surfaces to the first fluroplastic layer, inner surface to inner surface, with the second fluroplastic layer having its outer surface metallized forming a ground plane;

placing the transmission line structure in a recess found in one of the opposed substrates prior to encapsulation; and encapsulating the transmission line structure between opposed substrates.

13. A method for manufacturing a multilayer substrate having an integral transmission line as defined in claim 12, wherein the first and second fluroplastic layers are made of polyetrafluroethylene.

* * * * *

UNITED STATES PATENT AND TRADEMARK OFFICE
CERTIFICATE OF CORRECTION

PATENT NO.  : 5,065,122
DATED       : November 12, 1991
INVENTOR(S) : Juskey, et. al.

It is certified that error appears in the above-indentified patent and that said Letters Patent is hereby corrected as shown below:

On the Title page, item [54] in the title of the invention line 1, delete "FLUROPLASTIC" and insert therefor --FLUOROPLASTIC--.

Signed and Sealed this

Thirtieth Day of November, 1993

Attest:

BRUCE LEHMAN

*Attesting Officer*          *Commissioner of Patents and Trademarks*